(12) United States Patent
Houston

(10) Patent No.: US 8,945,999 B2
(45) Date of Patent: Feb. 3, 2015

(54) SRAM CELL WITH DIFFERENT CRYSTAL ORIENTATION THAN ASSOCIATED LOGIC

(71) Applicant: Texas Instruments Incorporated, Dallas, TX (US)

(72) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/330,128

(22) Filed: Jul. 14, 2014

(65) Prior Publication Data

US 2014/0322870 A1    Oct. 30, 2014

Related U.S. Application Data

(62) Division of application No. 13/570,918, filed on Aug. 9, 2012, which is a division of application No. 12/975,006, filed on Dec. 21, 2010, now Pat. No. 8,535,990, which is a division of application No. 12/427,416, filed on Apr. 21, 2009, now Pat. No. 8,324,665.

(51) Int. Cl.
*H01L 21/82* (2006.01)
*H01L 27/11* (2006.01)
*G11C 11/412* (2006.01)
*H01L 21/8238* (2006.01)
*H01L 27/12* (2006.01)

(52) U.S. Cl.
CPC .......... *H01L 27/1104* (2013.01); *G11C 11/412* (2013.01); *H01L 21/823807* (2013.01); *H01L 21/823878* (2013.01); *H01L 27/11* (2013.01); *H01L 27/1207* (2013.01)

USPC .......................................... 438/128; 257/255

(58) Field of Classification Search
CPC .................... G11C 11/412; H01L 27/823807; H01L 27/823878; H01L 27/11; H01L 27/1104; H01L 27/1207
USPC ............ 257/255, E21.602, E29.004; 428/128
See application file for complete search history.

(56) References Cited

U.S. PATENT DOCUMENTS

| | | | |
|---|---|---|---|
| 6,563,187 B1 | 5/2003 | Park | |
| 6,657,243 B2 | 12/2003 | Kumagai et al. | |
| 6,657,911 B2 | 12/2003 | Yamaoka et al. | |
| 7,041,544 B2 | 5/2006 | Yamauchi | |
| 7,208,815 B2 | 4/2007 | Chen et al. | |
| 7,217,978 B2 | 5/2007 | Joshi et al. | |
| 7,274,217 B2 | 9/2007 | Chuang et al. | |

(Continued)

*Primary Examiner* — Vongsavanh Sengdara
(74) *Attorney, Agent, or Firm* — Rose Alyssa Keagy; Frederick J. Telecky, Jr.

(57) ABSTRACT

An integrated circuit containing logic transistors and an array of SRAM cells in which the logic transistors are formed in semiconductor material with one crystal orientation and the SRAM cells are formed in a second semiconductor layer with another crystal orientation. A process of forming an integrated circuit containing logic transistors and an array of SRAM cells in which the logic transistors are formed in a top semiconductor layer with one crystal orientation and the SRAM cells are formed in an epitaxial semiconductor layer with another crystal orientation. A process of forming an integrated circuit containing logic transistors and an array of SRAM cells in which the SRAM cells are formed in a top semiconductor layer with one crystal orientation and the logic transistors are formed in an epitaxial semiconductor layer with another crystal orientation.

6 Claims, 14 Drawing Sheets

(56) References Cited

U.S. PATENT DOCUMENTS

| | | |
|---|---|---|
| 7,342,287 B2 | 3/2008 | Chuang et al. |
| 7,732,875 B2 | 6/2010 | Tsuchiaki |
| 7,754,560 B2 | 7/2010 | Burnett et al. |
| 7,879,660 B2 | 2/2011 | Booth, Jr. et al. |
| 8,129,790 B2 | 3/2012 | Sudo |
| 8,274,115 B2 | 9/2012 | Teo et al. |
| 2005/0191797 A1* | 9/2005 | Usuda et al. ............. 438/152 |
| 2006/0105536 A1* | 5/2006 | Cheng et al. ............. 438/386 |
| 2006/0231899 A1* | 10/2006 | Chang et al. ............. 257/368 |
| 2008/0258221 A1* | 10/2008 | Dennard et al. ............. 257/350 |
| 2009/0159932 A1* | 6/2009 | Pinto et al. ............. 257/255 |
| 2009/0159933 A1* | 6/2009 | Pinto et al. ............. 257/255 |
| 2009/0236663 A1* | 9/2009 | Teo et al. ............. 257/347 |

* cited by examiner

SRAM CELL WITH DIFFERENT CRYSTAL ORIENTATION THAN ASSOCIATED LOGIC

This is a division of application Ser. No. 13/570,918, filed Aug. 9, 2012, which is a division of application Ser. No. 12/975,006, filed Dec. 21, 2010, which is a division of application Ser. No. 12/427,416, filed Apr. 21, 2009, the contents of all are hereby incorporated by reference.

FIELD OF THE INVENTION

This invention relates to the field of integrated circuits. More particularly, this invention relates to static random access memories (SRAMs) in integrated circuits.

DETAILED DESCRIPTION

Figure 1A:
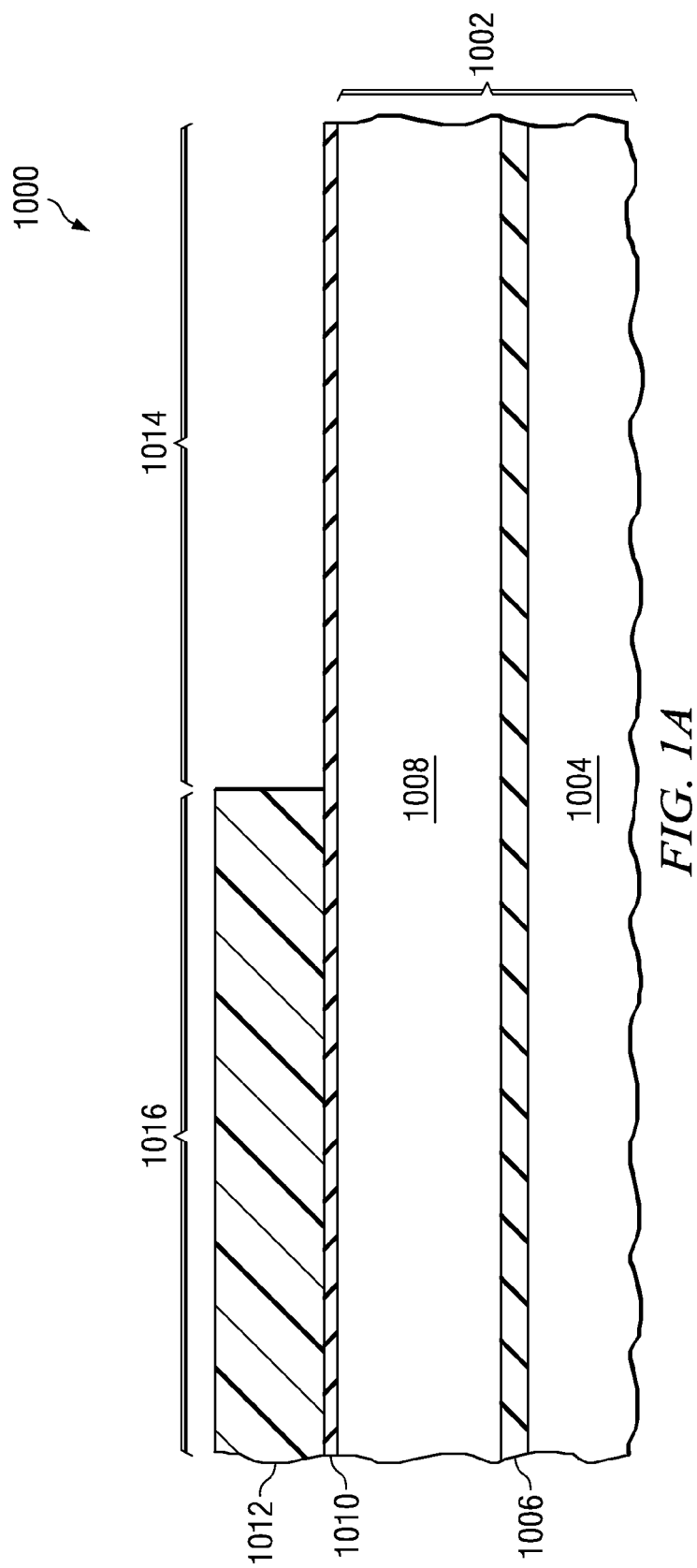
FIG. 1A through FIG. 1D are cross-sections of an integrated circuit, containing logic circuits and an array of SRAM cells, formed according to a first embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "Vdd" is understood to refer to a power supply node with a potential suitable for source nodes of p-channel metal oxide semiconductor (PMOS) transistors. The term "high voltage" is understood to mean a potential substantially equal to Vdd. Similarly, the term "Vss" is understood to refer to a power supply node with a potential suitable for source nodes of n-channel metal oxide semiconductor (NMOS) transistors, and is lower than the Vdd potential. The term "low voltage" is understood to mean a potential substantially equal to Vss. The term "floated" is understood to mean disconnected from a voltage source such as Vdd or Vss, or connected to a voltage source through high impedance.

In this disclosure, the term "driver transistor" is understood to refer to a metal oxide semiconductor (MOS) transistor in a static random access memory (SRAM) cell. A drain node of the driver transistor is connected to a data node of the SRAM cell. A gate node of the driver transistor is connected to an opposite data node of the SRAM cell from the driver drain node. A source node of the driver transistor is connected to a power supply node, typically either Vdd for PMOS driver transistors or Vss for NMOS driver transistors. A polarity of the driver transistor source node power supply is opposite a polarity of a read operation pre-charge potential of a corresponding data line which is connected to the driver transistor through a passgate transistor; that is, SRAM cells which pre-charge data lines to a high voltage have NMOS driver transistors, while SRAM cells which pre-charge data lines to a low voltage have PMOS driver transistors.

Similarly, the term "load transistor" is understood to refer to another MOS transistor in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS driver transistors or Vss for NMOS driver transistors. A polarity of the load transistor source node power supply is the same as the polarity of a read operation pre-charge potential of a corresponding data line which is connected to the driver transistor through a passgate transistor; that is, SRAM cells which pre-charge data lines to a high voltage have PMOS load transistors, while SRAM cells which pre-charge data lines to a low voltage have NMOS load transistors.

The term "passgate transistor" is understood to refer to yet another MOS transistor in the SRAM cell, of which one source/drain node is connected to a data node of the SRAM cell and an opposite source/drain node is connected to a corresponding data line of the SRAM cell.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit data line. A bit-bar-side data line is commonly referred to as a bit-bar data line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor, and a second passgate transistor if present, are turned on, and a bit data line, and a bit-bar line if present, are connected to read circuitry or write circuitry. The term "half-addressed SRAM cell" is understood to refer to an SRAM cell in which a passgate transistor, and a second passgate transistor if present, are turned on, while a bit data line and a bit-bar line if present, are disconnected from read or write circuitry.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays, such as microprocessors, digital signal processors and wireless telephony controllers, circuits which provide data to be stored in the SRAM array and circuits which use data from the SRAM array are located in the integrated circuit.

For the purposes of this disclosure, the term "logic" is understood to refer to digital Boolean entities. Similarly, the term "logic circuits" is understood to refer to circuits which perform digital Boolean operations such as binary addition. The term "logic transistors" is understood to refer to NMOS and PMOS transistors used in logic circuits.

The terminology "(100)-oriented" and "(100) orientation" refers to a crystal orientation in which the vector 1·x+0·y+0·z, or its equivalent, is perpendicular to the surface of the crystal, while the terminology "[110] axis" refers to a direction parallel to the vector 1·x+1·y+0·z, or its equivalent. For example, holes in a PMOS transistor have maximum mobility in (110)-oriented silicon when the PMOS transistor channel is aligned on a [110] axis. To assist readability of this disclosure, crystal orientations will be referred to using the nomenclature "(100)-oriented" or "(100) orientation" to avoid confusion with numerical designations of elements in the figures attached to this disclosure, for example "pad oxide layer (1010)."

An integrated circuit may contain a logic region and an SRAM region. A semiconductor material at a top surface of the logic region may have a first crystal orientation. A semiconductor material at a top surface of the SRAM region may have a second crystal orientation. NMOS and logic PMOS transistors may be formed in the logic region, and SRAM cells may be formed in the SRAM region. The first and second crystal orientations may be selected so that an average mobility of majority charge carriers of load transistors in the SRAM region may be higher than an average mobility of majority charge carriers of logic transistors in the logic region of a same polarity as the load transistors.

FIG. 1A through FIG. 1D are cross-sections of an integrated circuit, containing logic circuits and an array of SRAM cells, formed according to a first embodiment, depicted in successive stages of fabrication. The integrated circuit (1000) is formed on a commercially available silicon-on-insulator (SOI) starting wafer (1002), which includes a substrate (1004) commonly known as a support wafer, a buried oxide layer (1006) and a top layer (1008), commonly known as an SOI film. The support wafer (1004) is a single crystal semiconductor material, commonly silicon, with a first crystal orientation. The buried oxide layer (1006) is typically silicon dioxide between 0.1 and 1 microns thick formed on a top surface of the support wafer (1004). The SOI film (1008) is a single crystal semiconductor material, commonly silicon, with a second crystal orientation, and is commonly 500 nanometers to 5 microns thick, and frequently p-type with an electrical resistivity between 1 and 100 ohm-cm, and is formed on a top surface of the buried oxide layer (1006).

A layer of pad oxide (1010), typically silicon dioxide 5 to 50 nanometers thick grown by thermal oxidation, is formed on a top surface of the SOI film (1008). An additional hard mask dielectric layer (not shown) such as a silicon nitride layer may be formed on a top surface of the pad oxide layer (1010) to provide protection of the top surface of the SOI film (1008) during subsequent processing. An SRAM region photoresist pattern (1012) is formed on an existing top surface of the integrated circuit (1000) to expose an SRAM region (1014) and protect a logic region (1016) during a subsequent etch process. The SRAM region photoresist pattern (1012) may be formed for example by a sequence of steps starting with depositing a layer of photoresist on the existing top surface of the integrated circuit (1000). The photoresist layer is exposed in the SRAM regions to radiation, typically ultraviolet light, through a mask containing the pattern for the SRAM region. The exposure may be performed using commonly available photolithographic equipment, also known as a wafer stepper. The photoresist layer may be subsequently immersed in a developing fluid which dissolves the exposed photoresist, leaving a desired SRAM region photoresist pattern (1012) which is open in the SRAM region (1014).

Figure 1B:
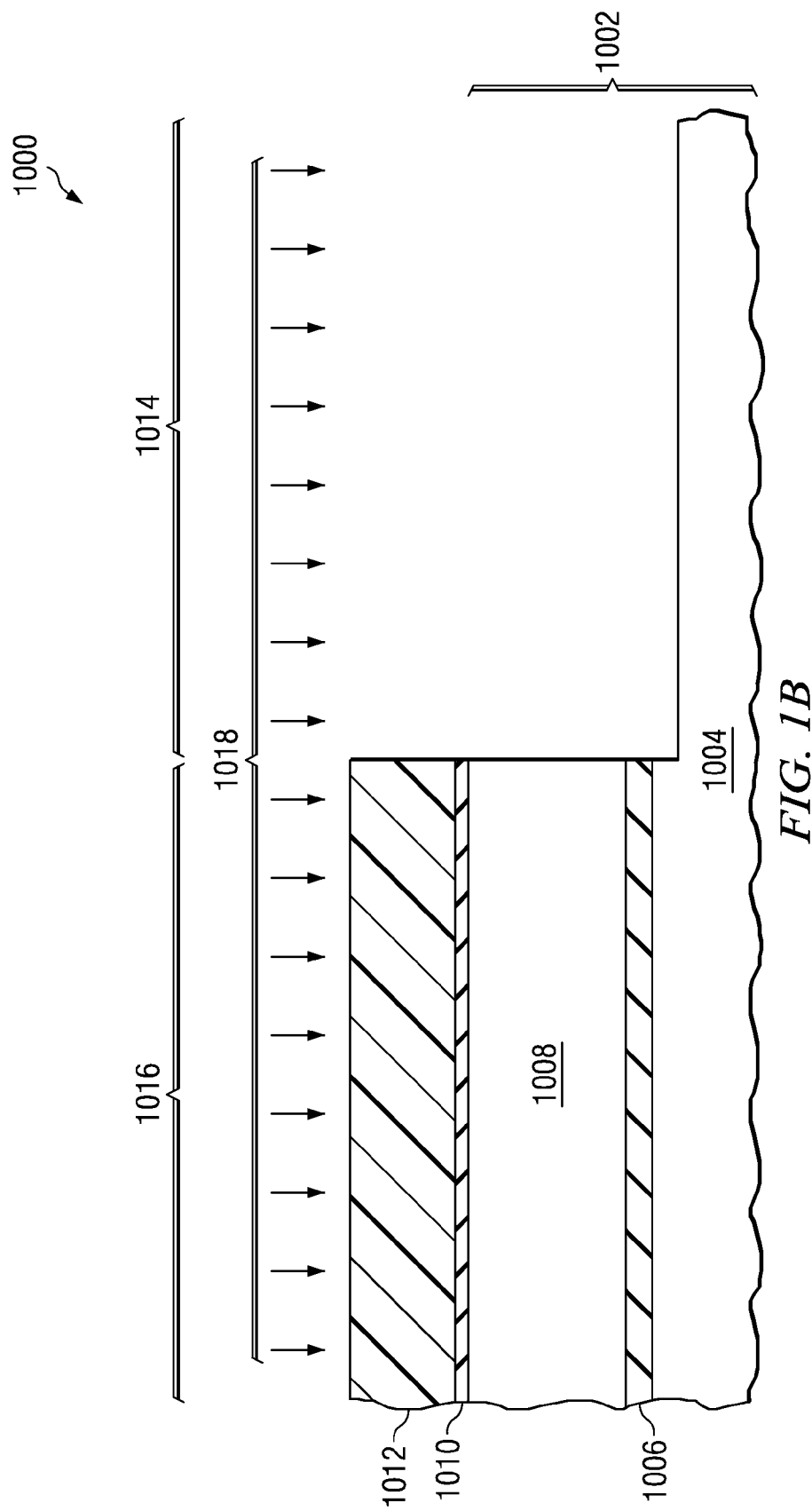

FIG. 1B depicts the integrated circuit (1000) during an SRAM region etch process to remove the pad oxide layer (1010), the SOI film (1008) and the buried oxide layer (1006) in the SRAM region (1014). The SRAM region etch process, schematically depicted in FIG. 1B as an etchant species (1018), may be performed for example by a reactive ion etching (RIE) process. The pad oxide layer (1010) may be removed during the REI process using a plasma containing fluorine. The SOI film (1008) may be removed during the REI process using plasma containing bromine and/or chlorine. The buried oxide layer (1006) may be removed during the REI process using a plasma containing fluorine. In an example process, a portion of the silicon in the support wafer (1004) in the SRAM region is removed by the etching process, in order to provide a suitable surface for a subsequent epitaxial growth process.

After the SRAM region etch process is completed, the SRAM region photoresist pattern (1012) is removed, for example by exposing the integrated circuit (1000) to an oxygen containing plasma, followed by a wet cleanup to remove any organic residue from the top surface of the pad oxide layer (1010).

Figure 1C:
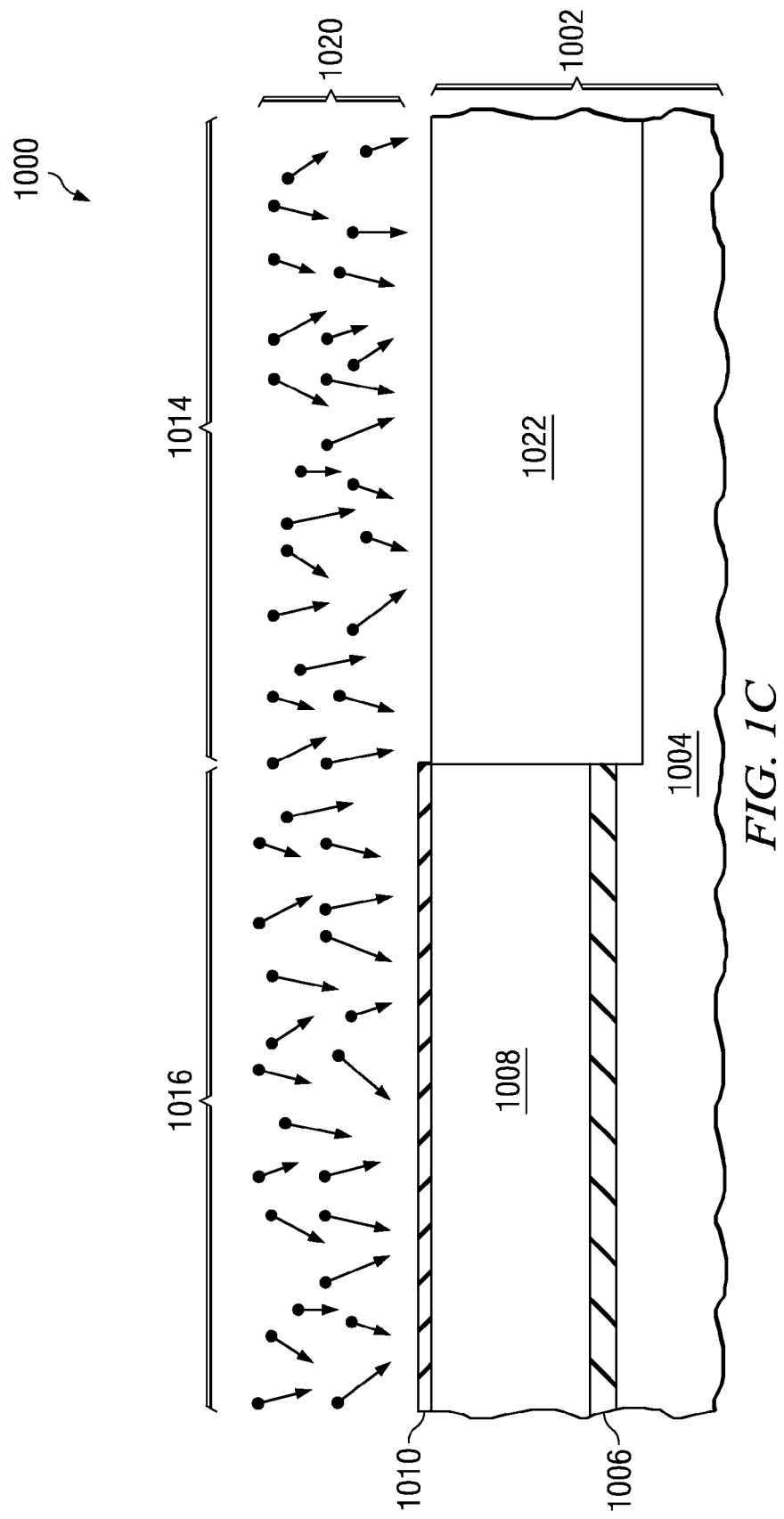

FIG. 1C depicts the integrated circuit (1000) during a selective epitaxial growth (SEG) process in the SRAM region (1014). The SEG process, schematically depicted in FIG. 1C by SEG reactive species (1020), may be performed using a mixture of SiH$_4$ gas and HCl gas at a temperature between 1010 C and 1030 C, or a mixture of SiH$_2$Cl$_2$ gas, H$_2$ gas and HCl gas at a temperature between 940 C and 960 C. The use of other known selective epitaxial growth techniques is within the scope of the instant embodiment. The SEG process forms an SEG layer (1022) on an existing top surface of the support wafer (1004) in the SRAM region (1014) such that little or no silicon material is formed on an existing top surface of the dielectric material covering the logic region (1016) including the pad oxide layer (1010). In one realization of the instant embodiment, the SEG layer (1022) may be substantially pure silicon. In another realization of the instant embodiment, p-type dopant atoms such as boron or gallium may be added. In a further realization of the instant embodiment, germanium or carbon atoms may be added to improve a material property, such as lateral stress, of the SEG layer (1022). Growth rates of the SEG layer (1022) range may from 1 to 100 nanometers per minute, depending on growth conditions and equipment used. The crystal orientation of the SEG layer (1022) is the same as the support wafer (1004). After the SEG process is completed, a top surface of the SEG layer (1022) may be planarized, for example by a chemical mechanical polishing (CMP) process, so that the top surface of the SEG layer (1022) is substantially even with the top surface of the SOI film (1008). The pad oxide layer (1010) and any other dielectric material over the logic region (1016) is removed, for example by immersing the integrated circuit (1000) in a dilute aqueous solution of hydrofluoric acid (HF) or a buffered HF solution.

Figure 1D:
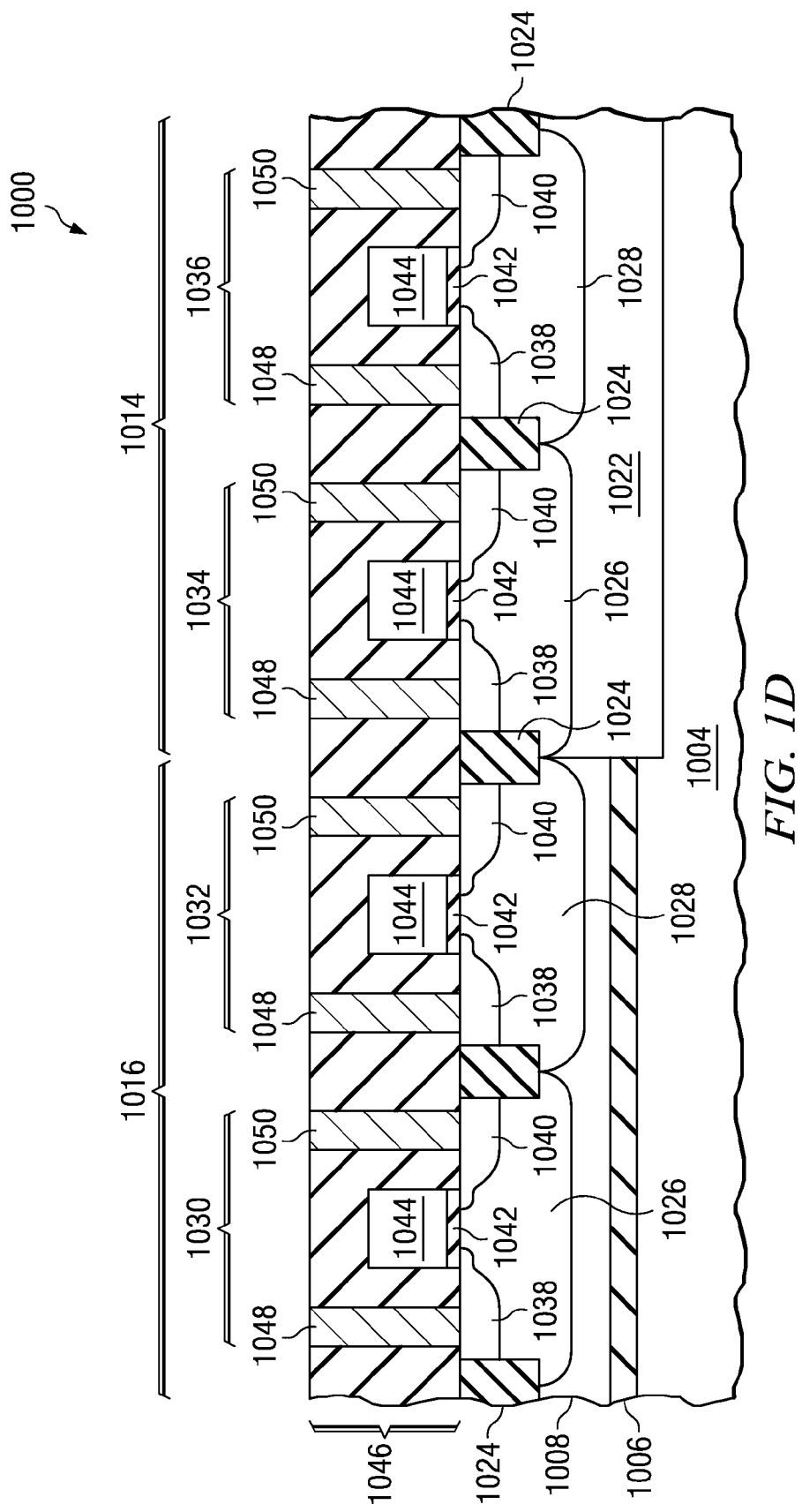

FIG. 1D depicts the integrated circuit (1000) after formation of logic NMOS and PMOS transistors in the logic region (1016) and SRAM NMOS and PMOS transistors in the array of SRAM cells in the SRAM region (1014). Elements of field oxide (1024) are formed in the SOI film (1008) and the SEG layer (1022) at an existing top surface of the integrated circuit (1000). The field oxide elements (1024) may be formed by a shallow trench isolation (STI) process sequence or other field oxide formation process. An STI process sequence includes etching trenches, commonly 200 to 500 nanometers deep, into the integrated circuit (1000). Sidewalls of the STI trenches are electrically passivated, commonly by growing a thermal oxide layer on sidewalls of the trenches. The STI trenches are filled with insulating material, typically silicon dioxide, commonly by a high density plasma (HDP) process or an ozone based thermal chemical vapor deposition (CVD) process, also known as the high aspect ratio process (HARP). The SOI film (1008) and the SEG layer (1022) are separated at the top surface of the integrated circuit (1000) by a field oxide element (1024).

P-type wells (1026), commonly called p-wells (1026), are formed in the SOI film (1008) and the SEG layer (1022), typically by ion implanting a p-well set of p-type dopants, including boron and possibly gallium and/or indium, at doses from $1 \cdot 10^{11}$ to $1 \cdot 10^{14}$ atoms/cm$^2$, into regions defined for NMOS transistors. A p-well photoresist pattern (not shown) is commonly used to block the p-well set of p-type dopants from regions defined for PMOS transistors. The p-wells (1026) extend from top surfaces of the SOI film (1008) and the SEG layer (1022) to a depth typically 50 to 500 nanometers below a bottom surface of the field oxide elements (1024). The ion implantation process to form the p-wells (1026) may include additional steps to implant additional p-type dopants at shallower depths for purposes of improving NMOS transistor performance, such as threshold adjustment, leakage current reduction and suppression of parasitic bipolar operation.

N-type wells (1028), commonly called n-wells (1028), are formed in the SOI film (1008) and the SEG layer (1022), typically by ion implanting an n-well set of n-type dopants, including phosphorus and arsenic, and possibly antimony, at doses from $1 \cdot 10^{11}$ to $1 \cdot 10^{14}$ atoms/cm$^2$, into regions defined for PMOS transistors. An n-well photoresist pattern (not shown) is commonly used to block the n-well set of n-type dopants from regions defined for NMOS transistors. The n-wells (1028) extend from top surfaces of the SOI film (1008) and the SEG layer (1022) to a depth typically 50 to 500 nanometers below the bottom surface of the field oxide elements (1024). The ion implantation process to form the n-wells (1028) may include additional steps to implant additional n-type dopants at shallower depths for purposes of improving PMOS transistor performance, such as threshold adjustment, leakage current reduction and suppression of parasitic bipolar operation. An average sheet resistivity of the n-wells (1028) is commonly between 100 and 1000 ohms/square.

A field oxide element (1024) separates the p-well (1026) from the n-well (1028) in the SOI film (1008). Another field oxide element (1024) separates the p-well (1026) from the n-well (1028) in the SEG layer (1022).

A logic NMOS transistor (1030) is formed in the p-well (1026) in the SOI film (1008) in the logic region (1016). A logic PMOS transistor (1032) is formed in the n-well (1028) in the SOI film (1008) in the logic region (1016). An SRAM NMOS transistor (1034) is formed in the p-well (1026) in the SEG layer (1022) in the SRAM region (1014). An SRAM PMOS transistor (1036) is formed in the n-well (1028) in the SEG layer (1022) in the SRAM region (1014). Each transistor (1030, 1032, 1034, 1036) includes a source region (1038), a drain region (1040), a gate dielectric layer (1042) and a gate (1044).

A pre-metal dielectric (PMD) layer (1046) is formed on an existing top surface of the integrated circuit (1000). Each transistor (1030, 1032, 1034, 1036) further includes a source contact (1048), a drain contact (1050) and a gate contact (not shown) formed in the PMD layer (1046).

In embodiments of the integrated circuit (1000) in which the SRAM cells contain NMOS driver transistors, a preferred crystal orientation of the support wafer (1004) may be a (100) orientation. The (100) orientation of the support wafer (1004) may allow lateral dimensions of the NMOS driver transistors to be reduced, consistent with fabrication practices used to manufacture the integrated circuit (1000).

In embodiments of the integrated circuit (1000) in which the SRAM cells contain PMOS driver transistors, a preferred crystal orientation of the support wafer (1004) may be a (110) orientation. The (110) orientation of the support wafer (1004) may allow lateral dimensions of the PMOS driver transistors to be reduced, consistent with fabrication practices used to manufacture the integrated circuit (1000).

Figure 2:
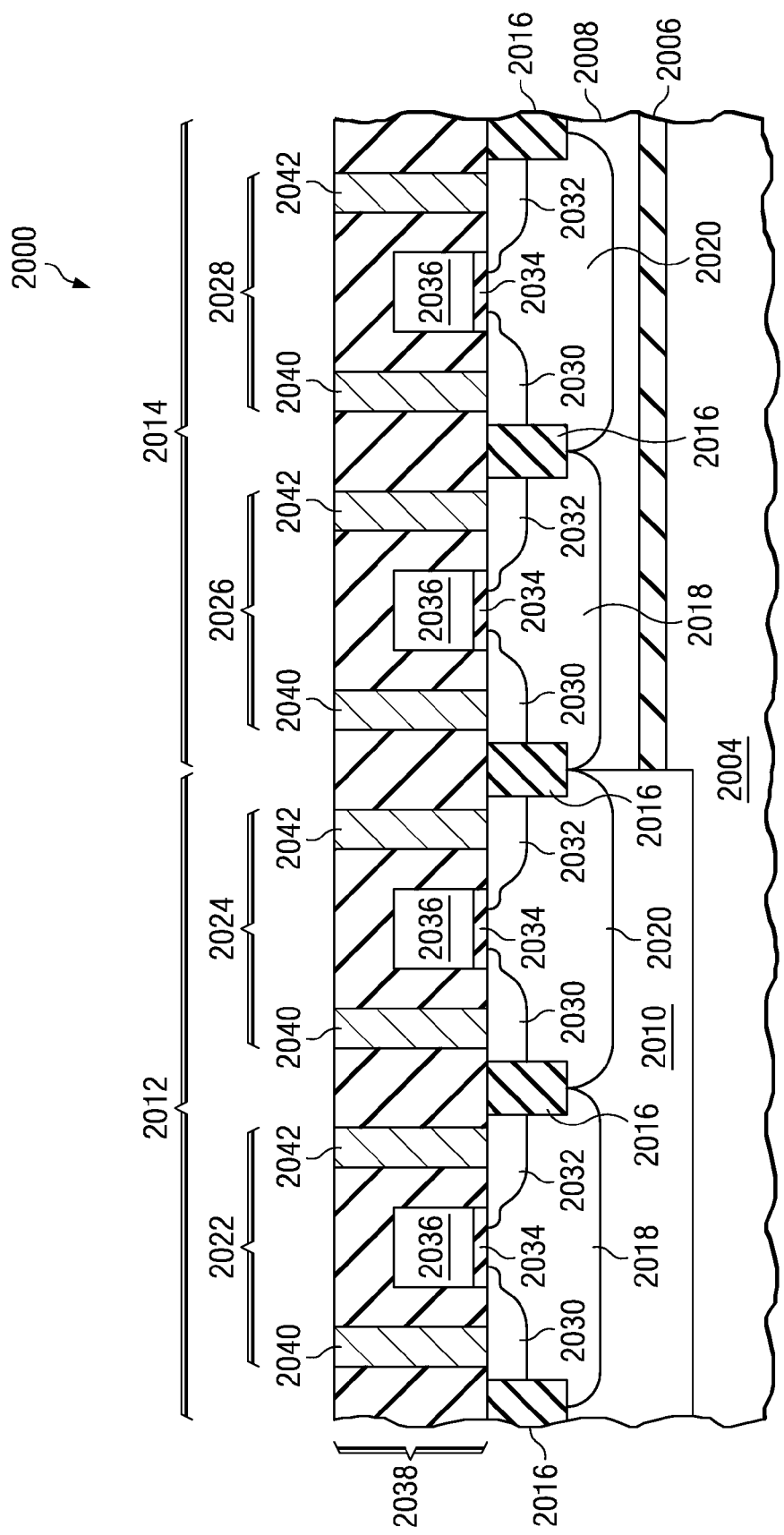
FIG. 2 is a cross-section of an integrated circuit, containing logic circuits and an array of SRAM cells, formed on a SOI wafer with an SEG layer, according to a second embodiment.

FIG. 2 is a cross-section of an integrated circuit (2000), containing logic circuits and an array of SRAM cells, formed on an SOI wafer with an SEG layer, according to a second embodiment. The integrated circuit is formed on an SOI wafer (2002), including a support wafer (2004), a buried oxide layer (2006) and an SOI film (2008) as described in reference to FIG. 1A through FIG. 1D. An SEG layer (2010) is formed in the SOI wafer (2002) as described in reference to FIG. 1A through FIG. 1D. In the instant embodiment, a logic region (2012) is defined in the SEG layer (2010) and an SRAM region (2014) is defined in the SOI film (2008). Field oxide elements (2016) are formed in the SOI film (2008) and the SEG layer (2010) at an existing top surface of the integrated circuit (2000), as described in reference to FIG. 1D. P-wells (2018) and n-wells (2020) are formed in the SOI film (2008) and the SEG layer (2010) as described in reference to FIG. 1D. A field oxide element (2016) separates the p-well (2018) from the n-well (2020) in the SOI film (2008). Another field oxide element (2016) separates the p-well (2018) from the n-well (2020) in the SEG layer (2010).

A logic NMOS transistor (2022) is formed in the p-well (2018) in the SEG layer (2010) in the logic region (2012). A logic PMOS transistor (2024) is formed in the n-well (2020) in the SEG layer (2010) in the logic region (2012). An SRAM NMOS transistor (2026) is formed in the p-well (2018) in the SOI film (2008) in the SRAM region (2014). An SRAM PMOS transistor (2028) is formed in the n-well (2020) in the SOI film (2008) in the SRAM region (2014). Each transistor (2022, 2024, 2026, 2028) includes a source region (2030), a drain region (2032), a gate dielectric layer (2034) and a gate (2036). A PMD layer (2038) is formed on an existing top surface of the integrated circuit (2000). Each transistor (2022, 2024, 2026, 2028) further includes a source contact (2040), a drain contact (2042) and a gate contact (not shown) formed in the PMD layer (2038).

In embodiments of the integrated circuit (2000) in which the SRAM cells contain NMOS driver transistors, a preferred crystal orientation of the SOI film (2008) may be a (100) orientation. The (100) orientation of the SOI film (2008) may allow lateral dimensions of the NMOS driver transistors to be reduced, consistent with fabrication practices used to manufacture the integrated circuit (2000).

In embodiments of the integrated circuit (2000) in which the SRAM cells contain PMOS driver transistors, a preferred crystal orientation of the SOI film (2008) may be a (110) orientation. The (110) orientation of the SOI film (2008) may allow lateral dimensions of the PMOS driver transistors to be reduced, consistent with fabrication practices used to manufacture the integrated circuit (2000).

The SEG layer (2022) may provide a reduced crystal defect density compared to the SOI film (2008), possibly providing a higher yield for the logic circuits.

Figure 3A:
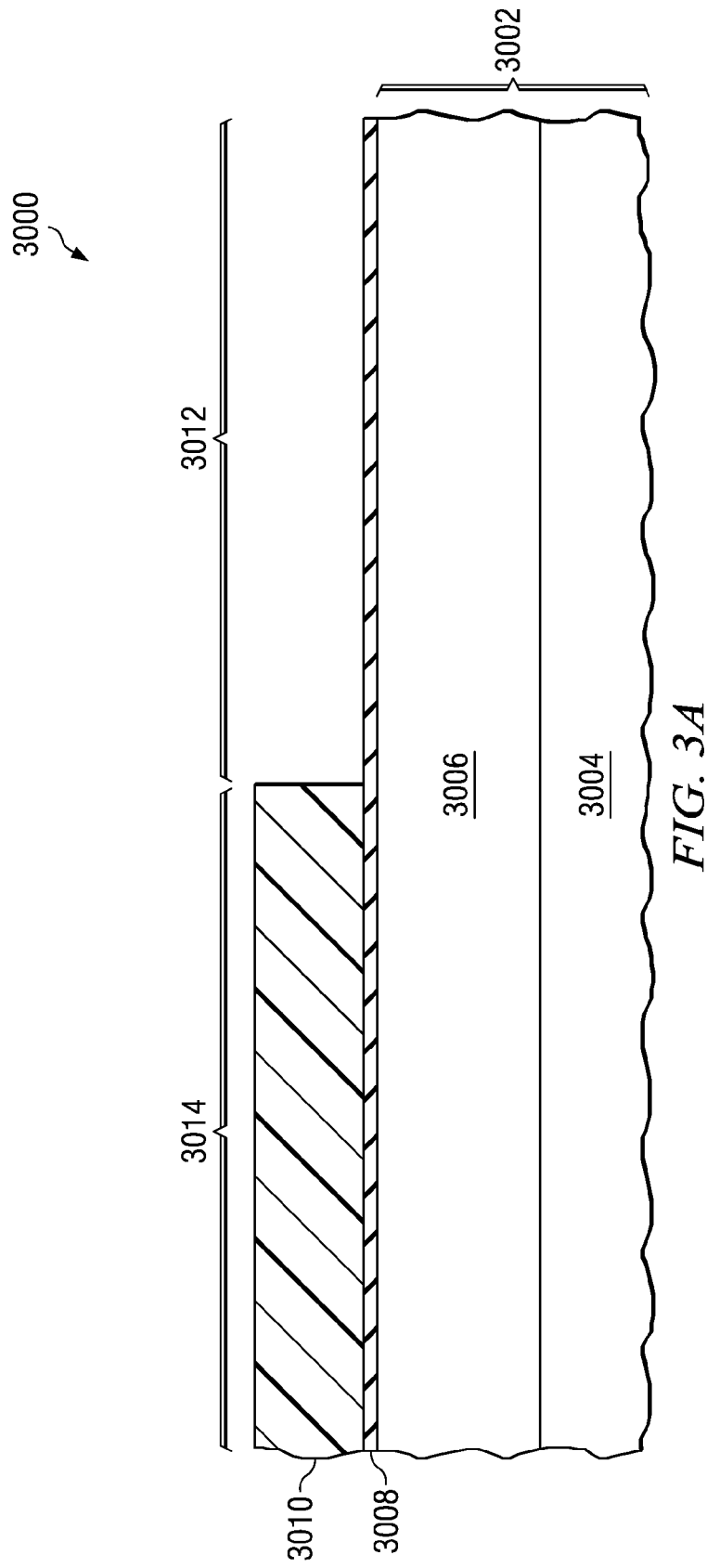
FIG. 3A through FIG. 3D are cross-sections of an integrated circuit, containing logic circuits and an array of SRAM cells, formed according to a third embodiment, depicted in successive stages of fabrication.

FIG. 3A through FIG. 3D are cross-sections of an integrated circuit, containing logic circuits and an array of SRAM cells, formed according to a third embodiment, depicted in successive stages of fabrication. As shown in FIG. 3A, the integrated circuit (3000) is formed on a commercially available direct silicon bonded (DSB) wafer (3002) which includes a single crystal substrate (3004) and a single crystal top layer (3006) commonly known as a DSB layer formed on a top surface of the substrate (3004). The substrate (3004), sometimes known as a handle wafer (3004), has a first crystal orientation. The DSB layer (3006) is typically 100 to 250 nanometers thick, and has a second crystal orientation.

A layer of pad oxide (3008), typically silicon dioxide 5 to 50 nanometers thick grown by thermal oxidation, is formed on a top surface of the DSB layer (3006). An additional hard mask dielectric layer (not shown) such as a silicon nitride layer may be formed on a top surface of the pad oxide layer (3008) to provide protection of the top surface of the DSB layer (3006) during subsequent processing. An SRAM region photoresist pattern (3010) is formed on an existing top surface of the integrated circuit (3000) to expose an SRAM region (3012) and protect a logic region (3014) during a subsequent etch process. The SRAM region photoresist pattern (3010) may be formed as described in reference to FIG. 1A.

Figure 3B:
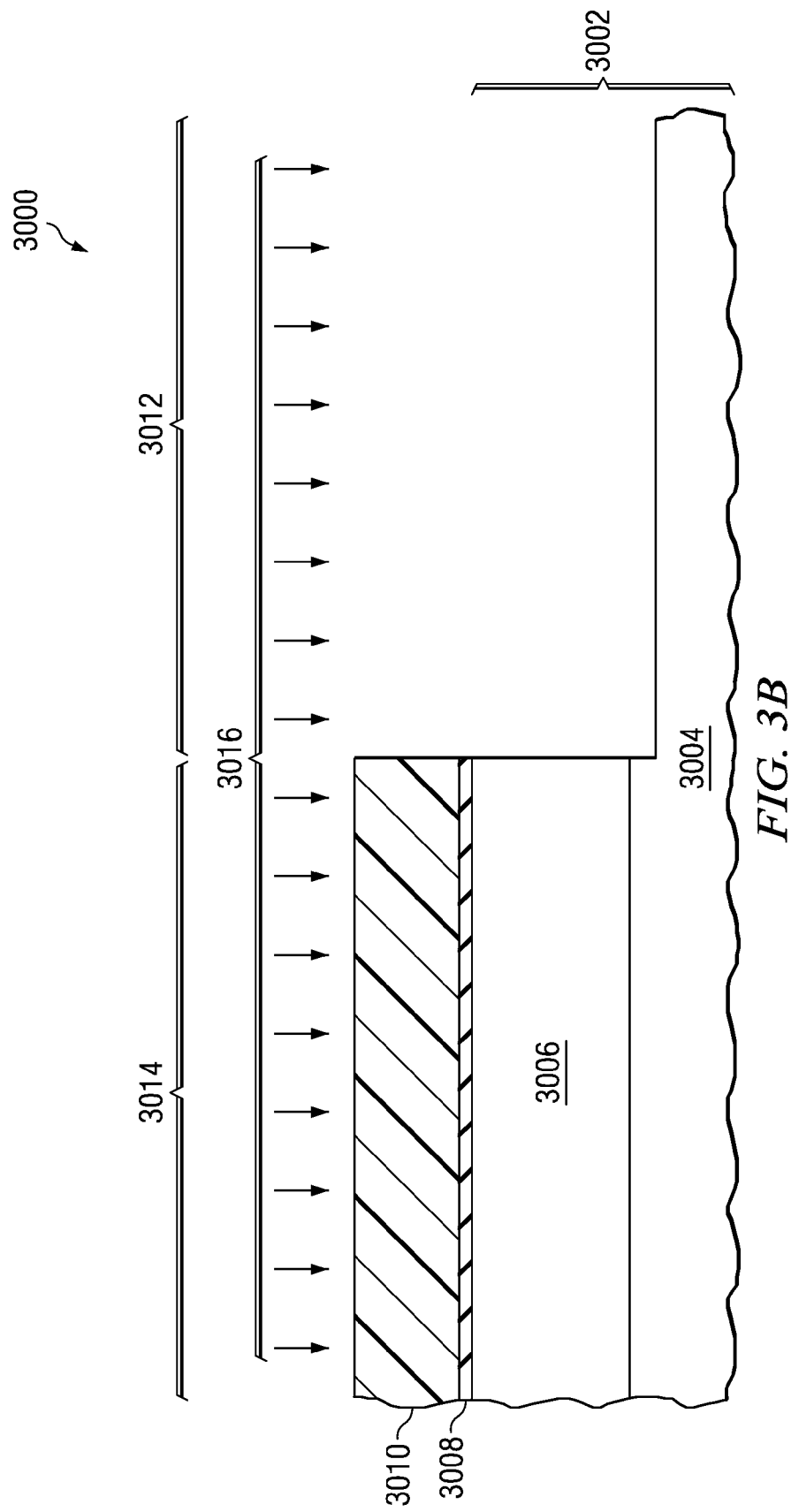

FIG. 3B depicts the integrated circuit (3000) during an SRAM region etch process to remove the pad oxide layer (3008) and the DSB layer (3006) in the SRAM region (3012). The SRAM region etch process, schematically depicted in FIG. 3B as an etchant species (3016), may be performed as described in reference to FIG. 1B. The pad oxide layer (3008) may be removed during an REI process using a plasma containing fluorine. The DSB layer (3006) may be removed during an REI process using a plasma containing bromine and/or chlorine. In one process, a portion of the silicon in the handle wafer (3004) in the SRAM region is removed by the etching process, in order to provide a suitable surface for a subsequent epitaxial growth process. After the SRAM region etch process is completed, the SRAM region photoresist pattern (3010) is removed as described in reference to FIG. 1B.

Figure 3C:
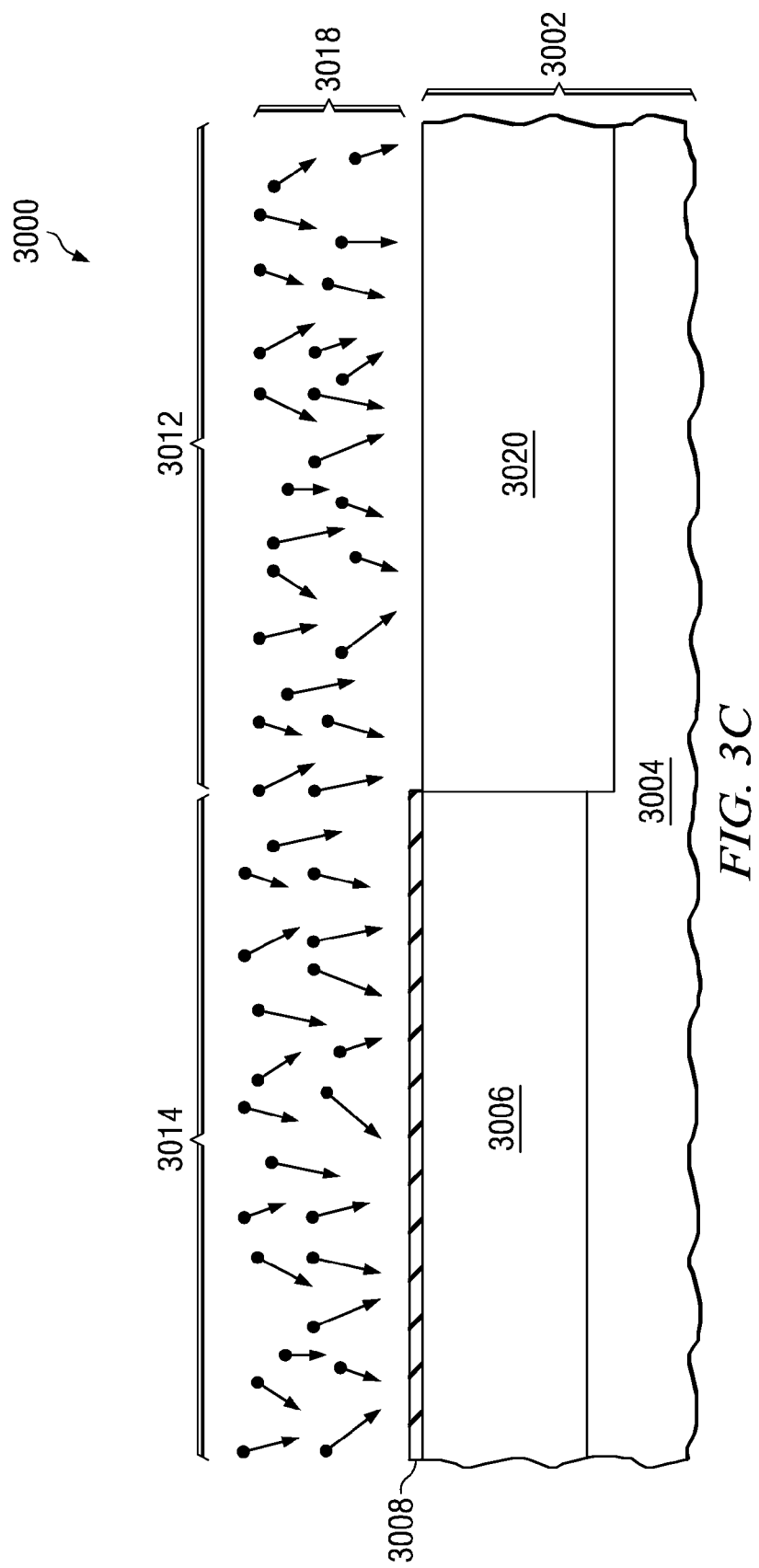

FIG. 3C depicts the integrated circuit (3000) during an SEG process in the SRAM region (3012). The SEG process, schematically depicted in FIG. 3C by SEG reactive species (3018), may be performed as described in reference to FIG. 1C. The use of other known selective epitaxial growth techniques is within the scope of the instant embodiment. The SEG process forms an SEG layer (3020) on an existing top surface of the handle wafer (3004) in the SRAM region (3012) such that little or no silicon material is formed on an existing top surface of the dielectric material covering the logic region (3014) including the pad oxide layer (3008). In one realization of the instant embodiment, the SEG layer (3020) may be substantially pure silicon. In another realization of the instant embodiment, p-type dopant atoms such as boron or gallium may be added. In a further realization of the instant embodiment, germanium or carbon atoms may be added to improve a material property, such as lateral stress, of the SEG layer (3020). The crystal orientation of the SEG layer (3020) is the same as the handle wafer (3004). After the SEG process is completed, a top surface of the SEG layer (3020) may be planarized as described in reference to FIG. 1C. The pad oxide layer (3008) and any other dielectric material over the logic region (3014) is removed as described in reference to FIG. 1C.

Figure 3D:
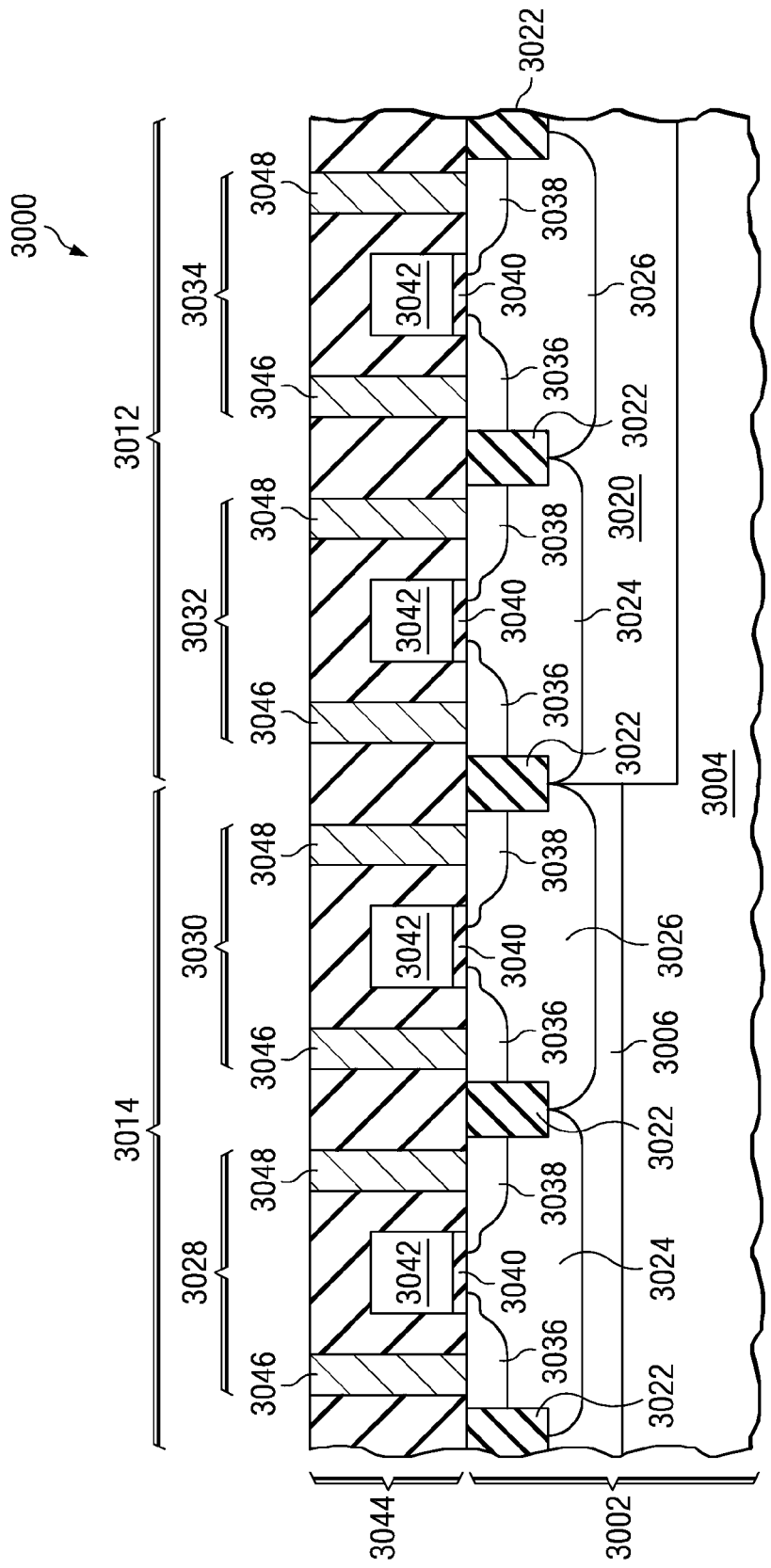

FIG. 3D depicts the integrated circuit (3000) after formation of logic NMOS and PMOS transistors in the logic region (3014) and SRAM NMOS and PMOS transistors in the array of SRAM cells in the SRAM region (3012). Elements of field oxide (3022) are formed in the DSB layer (3006) and the SEG layer (3020) at an existing top surface of the integrated circuit (3000), as described in reference to FIG. 1D. The DSB layer (3006) and the SEG layer (3020) are separated at the top surface of the integrated circuit (3000) by a field oxide element (3022).

P-wells (3024) and n-wells (3026) are formed in the DSB layer (3006) and the SEG layer (3020) as described in reference to FIG. 1D. A field oxide element (3022) separates the p-well (3024) from the n-well (3026) in the DSB layer (3006). Another field oxide element (3022) separates the p-well (3024) from the n-well (3026) in the SEG layer (3020).

A logic NMOS transistor (3028) is formed in the p-well (3024) in the DSB layer (3006) in the logic region (3014). A logic PMOS transistor (3030) is formed in the n-well (3026) in the DSB layer (3006) in the logic region (3014). An SRAM NMOS transistor (3032) is formed in the p-well (3024) in the SEG layer (3020) in the SRAM region (3012). An SRAM PMOS transistor (3034) is formed in the n-well (3026) in the SEG layer (3020) in the SRAM region (3012). Each transistor (3028, 3030, 3032, 3034) includes a source region (3036), a drain region (3038), a gate dielectric layer (3040) and a gate (3042).

A PMD layer (3044) is formed on an existing top surface of the integrated circuit (3000). Each transistor (3028, 3030, 3032, 3034) further includes a source contact (3046), a drain contact (3048) and a gate contact (not shown) formed in the PMD layer (3044).

In embodiments of the integrated circuit (3000) in which the SRAM cells contain NMOS driver transistors, a preferred crystal orientation of the substrate (3004) may be a (100) orientation. The (100) orientation of the substrate (3004) may allow lateral dimensions of the NMOS driver transistors to be reduced, consistent with fabrication practices used to manufacture the integrated circuit (3000).

In embodiments of the integrated circuit (3000) in which the SRAM cells contain PMOS driver transistors, a preferred crystal orientation of the substrate (3004) may be a (110) orientation. The (110) orientation of the substrate (2004) may allow lateral dimensions of the PMOS driver transistors to be reduced, consistent with fabrication practices used to manufacture the integrated circuit (3000).

The SEG layer (3020) may provide a reduced crystal defect density compared to the DSB layer (3006), possibly allowing fewer redundant SRAM cells to maintain an SRAM yield target.

Figure 4:
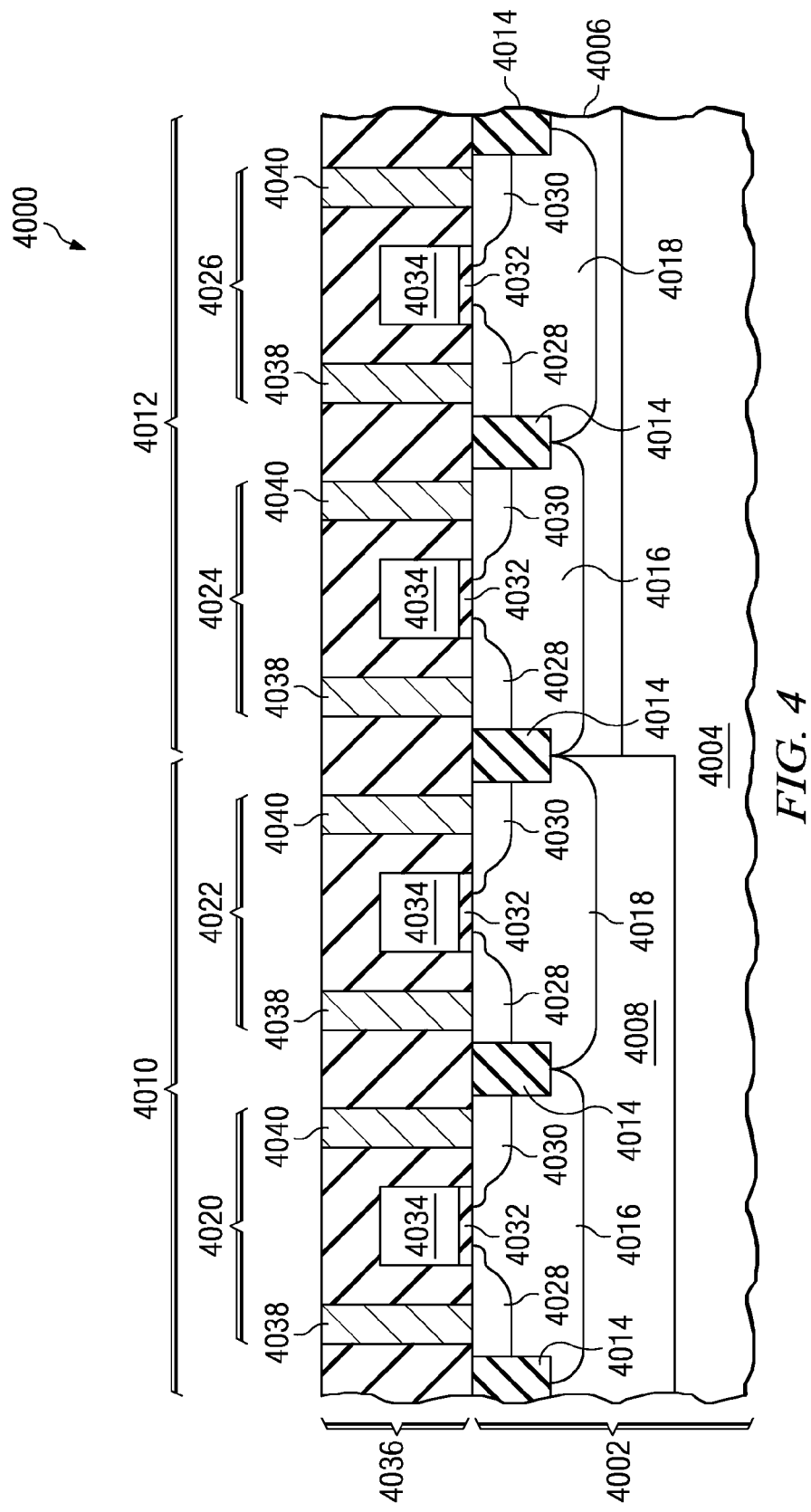
FIG. 4 is a cross-section of an integrated circuit, containing logic circuits and an array of SRAM cells, formed on a DSB wafer with an SEG layer, according to a fourth embodiment.

FIG. 4 is a cross-section of an integrated circuit, containing logic circuits and an array of SRAM cells, formed on a DSB wafer with an SEG layer, according to a fourth embodiment. The integrated circuit (4000) is formed on a DSB wafer (4002), including a handle wafer (4004) and a DSB layer (4006) as described in reference to FIG. 3A through FIG. 3D. An SEG layer (4008) is formed in the DSB wafer (4002) as described in reference to FIG. 2A through FIG. 2D. In the instant embodiment, a logic region (4010) is defined in the SEG layer (4008) and an SRAM region (4012) is defined in the DSB layer (4006). Field oxide elements (4014) are formed in the DSB layer (4006) and the SEG layer (4008) at an existing top surface of the integrated circuit (4000), as described in reference to FIG. 1D. P-wells (4016) and n-wells (4018) are formed in the DSB layer (4006) and the SEG layer (4008) as described in reference to FIG. 1D. A field oxide element (4014) separates the p-well (4016) from the n-well (4018) in the DSB layer (4006). Another field oxide element (4014) separates the p-well (4016) from the n-well (4018) in the SEG layer (4008).

A logic NMOS transistor (4020) is formed in the p-well (4016) in the SEG layer (4008) in the logic region (4010). A logic PMOS transistor (4022) is formed in the n-well (4018) in the SEG layer (4008) in the logic region (4010). An SRAM NMOS transistor (4024) is formed in the p-well (4016) in the DSB layer (4006) in the SRAM region (4012). An SRAM PMOS transistor (4026) is formed in the n-well (4018) in the DSB layer (4006) in the SRAM region (4012). Each transistor (4020, 4022, 4024, 4026) includes a source region (4028), a drain region (4040), a gate dielectric layer (4032) and a gate (4034). A PMD layer (4036) is formed on an existing top surface of the integrated circuit (4000). Each transistor (4020, 4022, 4024, 4026) further includes a source contact (4038), a drain contact (4040) and a gate contact (not shown) formed in the PMD layer (4036).

In embodiments of the integrated circuit (4000) in which the SRAM cells contain NMOS driver transistors, a preferred crystal orientation of the DSB layer (4006) may be a (100) orientation. The (100) orientation of the DSB layer (4006) may allow lateral dimensions of the NMOS driver transistors to be reduced, consistent with fabrication practices used to manufacture the integrated circuit (4000).

In embodiments of the integrated circuit (4000) in which the SRAM cells contain PMOS driver transistors, a preferred crystal orientation of the DSB layer (4006) may be a (110) orientation. The (110) orientation of the DSB layer (4006) may allow lateral dimensions of the PMOS driver transistors to be reduced, consistent with fabrication practices used to manufacture the integrated circuit (4000).

The SEG layer (4008) may provide a reduced crystal defect density compared to the DSB layer (4006), possibly providing a higher yield for the logic circuits.

Figure 5:
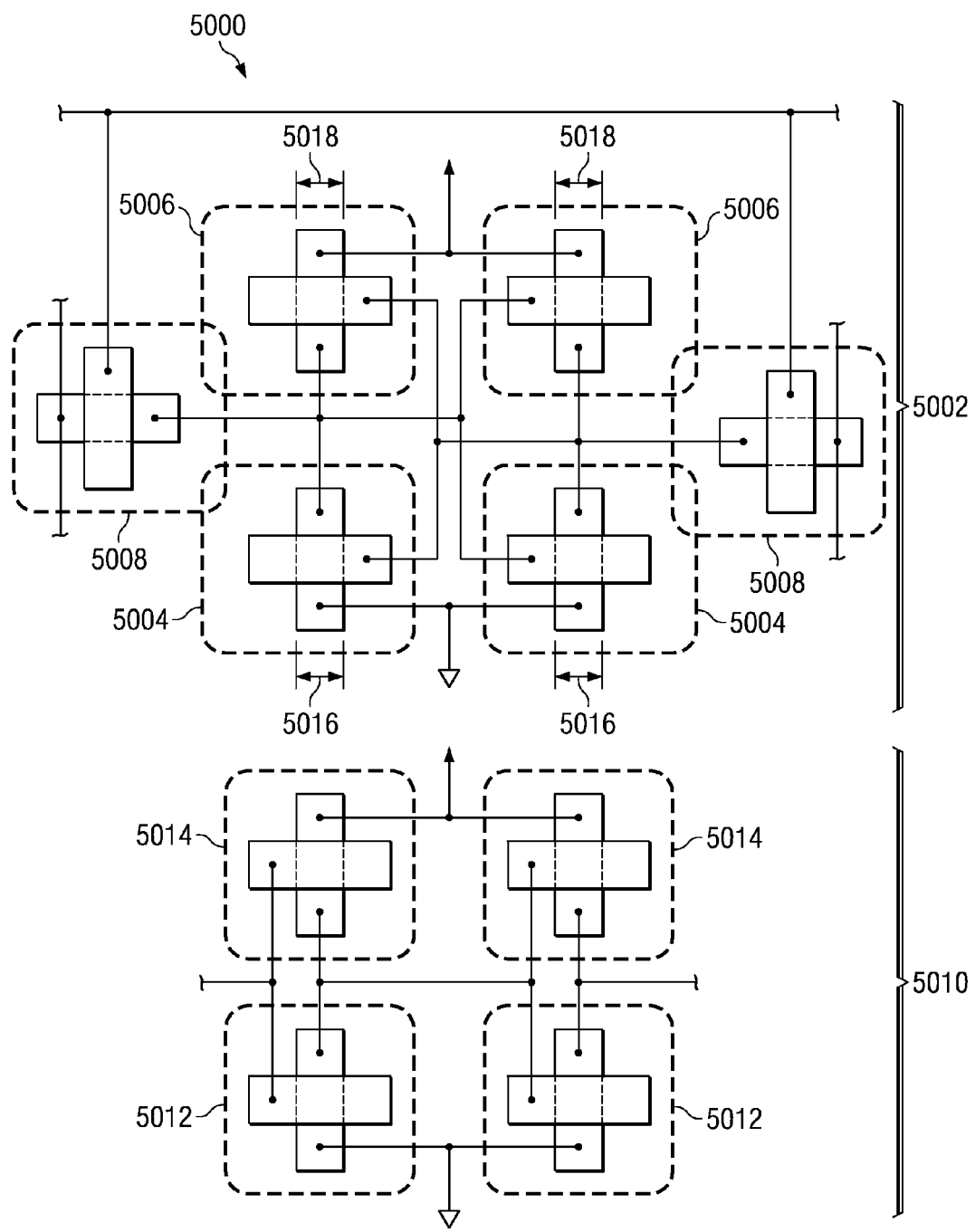
FIG. 5 is a top view of an integrated circuit containing logic transistors and an array of six transistor (6T) SRAM cells, formed according to an embodiment.

FIG. 5 is a top view of an integrated circuit containing logic transistors and an array of six transistor (6T) SRAM cells, formed according to an embodiment. Each 6T SRAM cell in the SRAM region (5002) contains NMOS driver transistors (5004), PMOS load transistors (5006) and NMOS passgate transistors (5008). Each logic region (5010) includes logic NMOS transistors (5012) and logic PMOS transistors (5014). A crystal orientation of a semiconductor material in which the logic transistors (5010) are formed, for example a (110) orientation, is selected to provide a higher ratio of PMOS majority charge carrier mobility to NMOS majority charge carrier mobility compared to other crystal orientations. A crystal orientation of a semiconductor material containing the SRAM cell (5002), for example a (100) orientation, is selected to provide a higher ratio of NMOS majority charge carrier mobility to PMOS majority charge carrier mobility compared to other crystal orientations.

In one realization of the instant embodiment, an average majority charge carrier mobility of the NMOS driver transistors (5004) may be higher than an average majority charge carrier mobility of the logic NMOS transistors (5012). In a further realization of the instant embodiment, an average majority charge carrier mobility of the PMOS load transistors (5006) may be less than an average majority charge carrier mobility of the logic PMOS transistors (5014).

Utilizing the embodiments described supra, a width (5016) of an NMOS driver transistor (5004) and the width (5018) of a PMOS load transistor (5006) may be reduced, consistent with fabrication practices used to manufacture the integrated circuit (5000), while maintaining a ratio of average driver transistor on-state current to average load transistor on-state current within a desired range. Reducing the width (5016) of the NMOS driver transistors (5004) and the width (5018) of the PMOS load transistors (5006) may allow a reduction in area of the integrated circuit (5000), providing a reduction in manufacturing costs.

Figure 6:
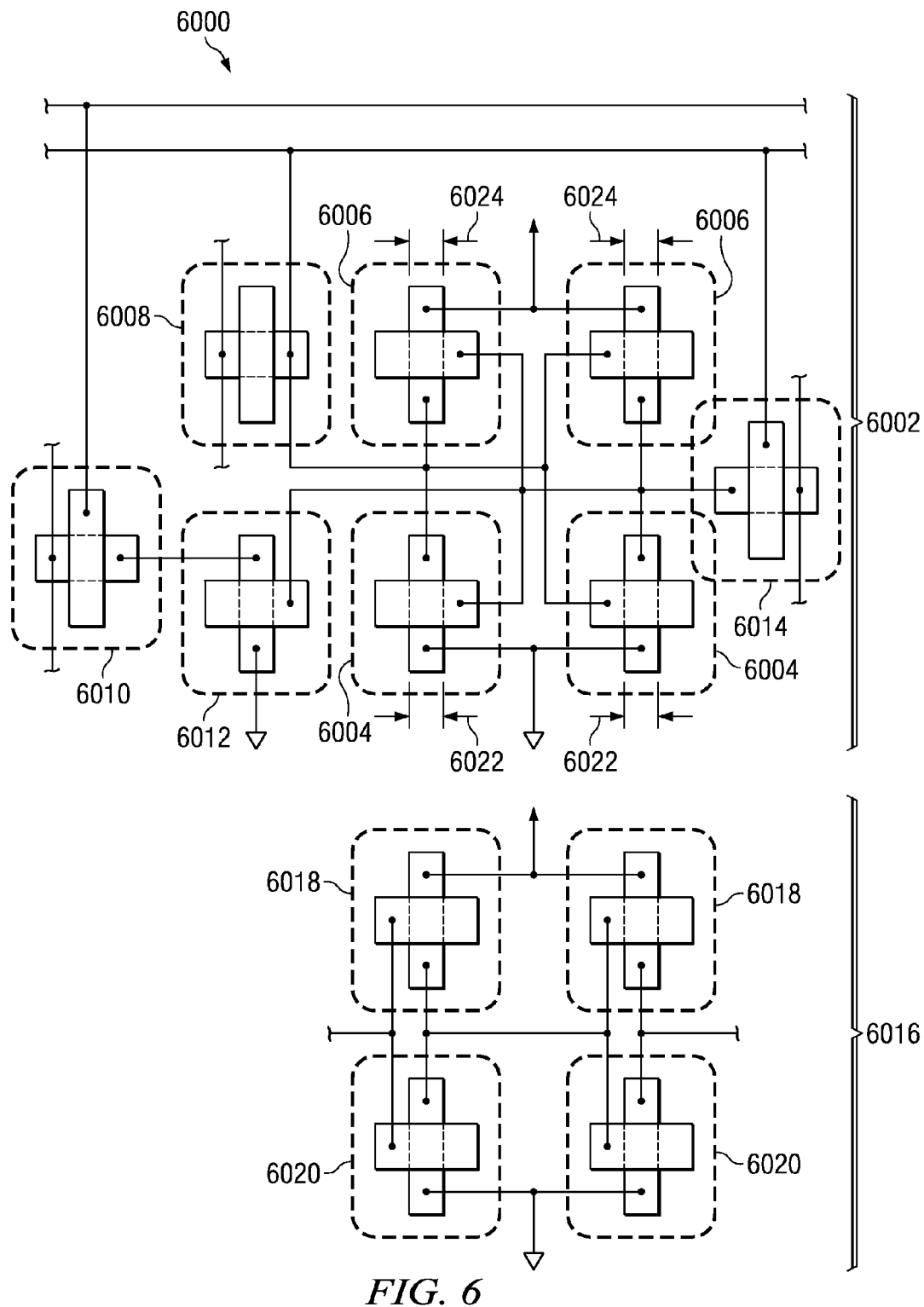
FIG. 6 is a top view of an integrated circuit containing logic transistors and an array of eight transistor (8T) SRAM cells, formed according to an embodiment.

FIG. 6 is a top view of an integrated circuit containing logic transistors and an array of eight transistor (8T) SRAM cells, formed according to an embodiment. Each 8T SRAM cell (6002) contains NMOS driver transistors (6004), PMOS load transistors (6006), an NMOS bit-side passgate transistor (6008), an NMOS bit-side read passgate transistor (6010), an NMOS bit-side read buffer transistor (6012) and an NMOS bit-bar-side passgate transistor (6014). The logic region (6016) includes logic NMOS transistors (6018) and logic PMOS transistors (6020). A crystal orientation of a semiconductor material in which the logic transistors (6016) are formed, for example a (110) orientation, is selected to provide a higher ratio of PMOS majority charge carrier mobility to NMOS majority charge carrier mobility compared to other crystal orientations. A crystal orientation of a semiconductor material containing the SRAM cell (6002), for example a (100) orientation, is selected to provide a higher ratio of NMOS majority charge carrier mobility to PMOS majority charge carrier mobility compared to other crystal orientations.

In one realization of the instant embodiment, an average majority charge carrier mobility of the NMOS driver transistors (6004) may be higher than an average majority charge carrier mobility of the logic NMOS transistors (6018), and an average majority charge carrier mobility of the NMOS buffer transistors (6012) may be higher than an average majority charge carrier mobility of the logic NMOS transistors (6018). In a further realization of the instant embodiment, an average majority charge carrier mobility of the PMOS load transistors (6006) may be less than an average majority charge carrier mobility of the logic PMOS transistors (6020).

A NMOS driver transistor width (6022) and a PMOS load transistor width (6024) may be reduced, consistent with fabrication practices used to manufacture the integrated circuit (6000), while maintaining a ratio of average driver transistor on-state current to average load transistor on-state current within a desired range. Reducing the width (6022) of the NMOS driver transistors (6004) and the width (6024) of the PMOS load transistors (6006) may allow a reduction in area of the integrated circuit (6000), providing a reduction in manufacturing costs.

Figure 7:
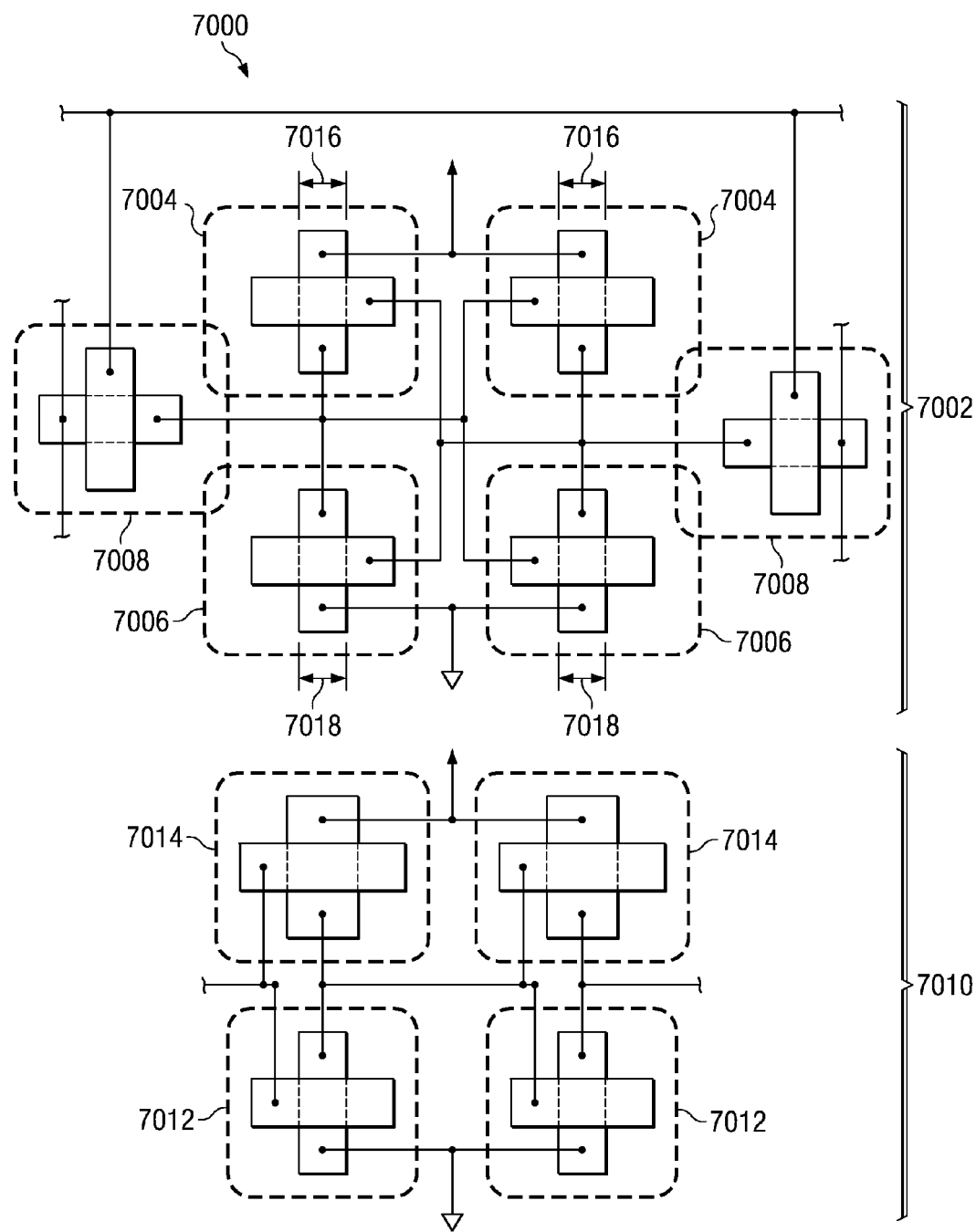
FIG. 7 is a top view of an integrated circuit containing logic transistors and an array of 6T SRAM cells, formed according to an alternate embodiment.

FIG. 7 is a top view of an integrated circuit containing logic transistors and an array of 6T SRAM cells, formed according to an alternate embodiment. Each 6T SRAM cell (7002) contains PMOS driver transistors (7004), NMOS load transistors (7006) and PMOS passgate transistors (7008). The logic region (7010) includes logic NMOS transistors (7012) and logic PMOS transistors (7014). A crystal orientation of a semiconductor material in which the logic transistors (7010) are formed, for example a (100) orientation, is selected to provide a higher ratio of NMOS majority charge carrier mobility to PMOS majority charge carrier mobility compared to other crystal orientations. A crystal orientation of a semiconductor material containing the SRAM cell (7002), for example a (110) orientation, is selected to provide a higher ratio of PMOS majority charge carrier mobility to NMOS majority charge carrier mobility compared to other crystal orientations.

In one realization of the instant embodiment, an average majority charge carrier mobility of the PMOS driver transistors (7004) may be more than an average majority charge carrier mobility of the logic PMOS transistors (7014). In a further realization of the instant embodiment, an average majority charge carrier mobility of the NMOS load transistors (7006) may be less than an average majority charge carrier mobility of the logic NMOS transistors (7012).

A PMOS driver transistor width (7016) and an NMOS load transistor width (7018) may be reduced, consistent with fabrication practices used to manufacture the integrated circuit (7000), while maintaining a ratio of average driver transistor on-state current to average load transistor on-state current within a desired range. Reducing the width (7016) of the PMOS driver transistors (7004) and the width (7018) of the NMOS load transistors (7006) may allow a reduction in area of the integrated circuit (7000), providing a reduction in manufacturing costs.

Figure 8:
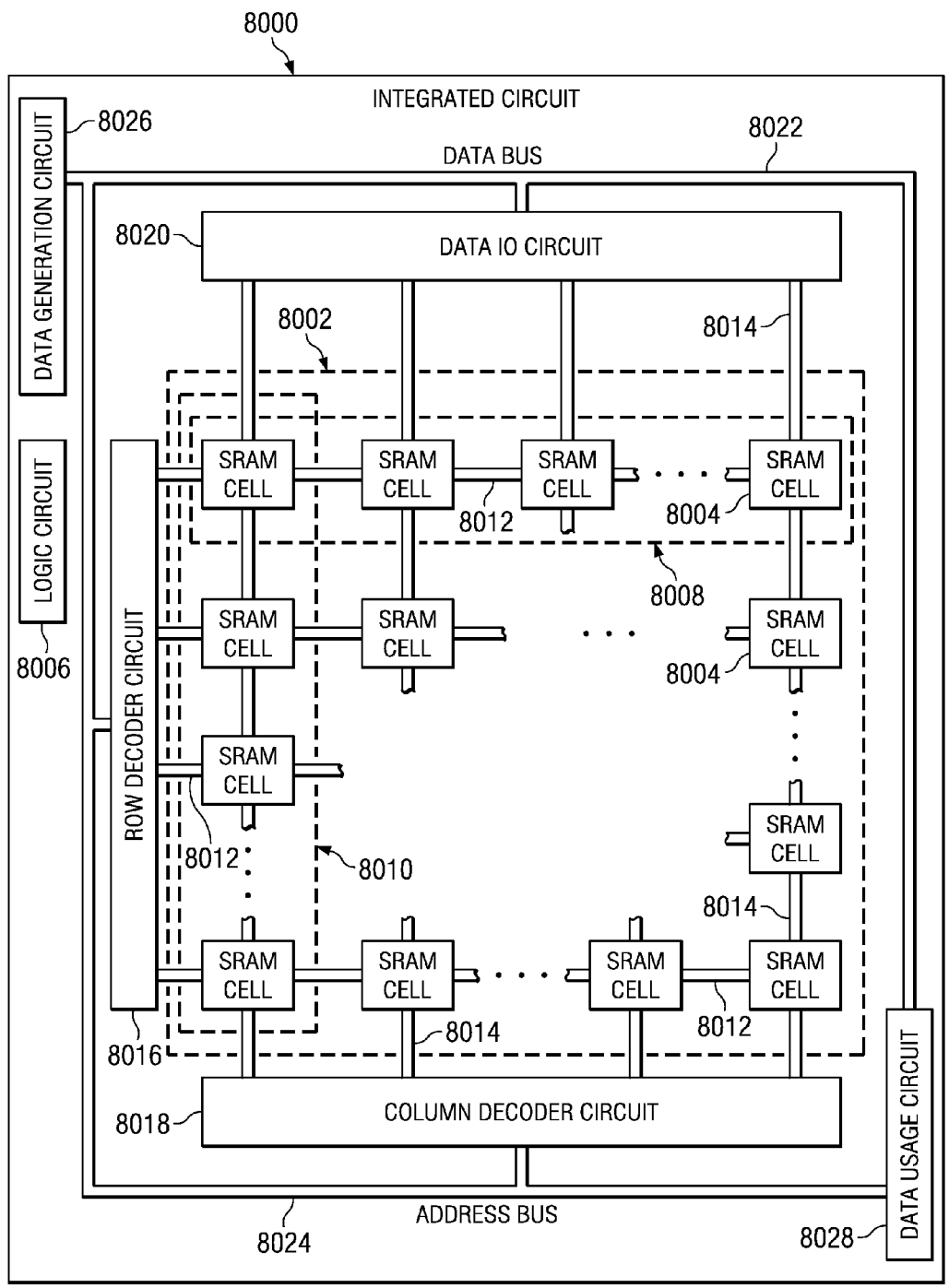
FIG. 8 depicts an integrated circuit containing an SRAM cell array which includes SRAM cells, and one or more logic circuits, formed according to an embodiment.

FIG. 8 depicts an integrated circuit (8000) containing an SRAM cell array (8002) which includes SRAM cells (8004), and one or more logic circuits (8006), formed according to an embodiment. The SRAM cells (8004) are formed in a semiconductor layer having a first orientation. Transistors in the logic circuits (8006) are formed in a semiconductor layer having a second orientation different from the first orientation. The SRAM cells (8004) are arranged in rows (8008) and columns (8010). Each word line (8012) is connected to SRAM cells (8004) in a row (8008). Each bit line bus (8014) is connected to SRAM cells (8004) in a column (8010). Each bit line bus (8014) may include one or more bit or bit-bar lines (8024). A row decoder circuit (8016) applies appropriate biases to word lines (8012). A column decoder circuit (8018) applies appropriate biases to bit or bit-bar lines in the bit line buses (8014). A data input/output (IO) circuit (8020) reads data from the bit or bit-bar lines in the bit line buses (8014) during read operations and applies appropriate potentials to the bit or bit-bar lines in the bit line buses (8014) during write operations. The integrated circuit (8000) further includes a data bus (8022) which carries data bits between the SRAM cell array (8002) and other circuits in the integrated circuit (8000), and an address bus (8024) which is used to select SRAM cells (8004) in the SRAM cell array (8002) for read and write operations. The address bus (8024) is connected to the row decoder circuit (8016), the column decoder circuit (8018). The integrated circuit (8000) may also contain a data generation circuit (8026) which connects to the data bus (8022) and address bus (8024). The data generation circuit (8026) produces incoming data bits for storage in the SRAM cell array (8002). The data bus (8022) carries the incoming data bits from the data generation circuit (8026) to the SRAM cell array (8002). The integrated circuit (8000) may also contain a data usage circuit (8028) which connects to the data bus (8022) and address bus (8024). The data usage circuit (8028) uses outgoing data bits which were stored in the SRAM cell array (8002). The data bus (8022) carries the outgoing data bits from the SRAM cell array (8002) to the data usage circuit (8028). The data generation circuit (8026) or data usage circuit (8028), if present, are formed in a semiconductor layer having the second orientation.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising:
providing a wafer, said wafer further including:
a substrate of a semiconductor material with a first crystal orientation; and
a top layer of semiconductor material with a second crystal orientation formed over said substrate;
removing said top layer of semiconductor material in an SRAM region to expose said substrate;
growing an epitaxial layer of semiconductor material on said substrate in said SRAM region, wherein said epitaxial layer has said first crystal orientation;
forming an array of SRAM cells in said epitaxial layer in said SRAM region, in which each said SRAM cell further includes:
two SRAM NMOS transistors; and
two SRAM PMOS transistors; and
forming a logic circuit in said top layer of semiconductor material, said logic circuit further including:
a plurality of logic NMOS transistors; and
a plurality of logic PMOS transistors, such that an average majority charge carrier mobility of said SRAM PMOS transistors is less than an average majority charge carrier mobility of said logic PMOS transistors.

2. The process of claim 1, in which:
said SRAM NMOS transistors are driver transistors: and
said SRAM PMOS transistors are load transistors.

3. The process of claim 1, in which an average majority charge carrier mobility of said SRAM NMOS transistors is more than an average majority charge carrier mobility of said logic NMOS transistors.

4. The process of claim 1, in which:
said first crystal orientation has a (110) orientation; and
said second crystal orientation has a (100) orientation.

5. The process of claim 1, in which:
said wafer is an SOI wafer further including a buried oxide layer between said substrate and said top layer of semiconductor material; and
said step of removing said top layer of semiconductor material in said SRAM region further includes:
forming a pad oxide layer on a top surface of said top layer of semiconductor material;
forming an SRAM region photoresist pattern on an existing top surface of said integrated circuit, said SRAM region photoresist pattern exposing said top layer of semiconductor material in said SRAM region;
removing said pad oxide in said SRAM region by an oxide RIE process;
removing said top layer of semiconductor material in said SRAM region by a silicon RIE process; and removing said buried oxide layer in said SRAM region by an oxide RIE process.

6. The process of claim 1, in which:

said wafer is a DSB wafer; and said step of removing said top layer of semiconductor material in said SRAM region further includes steps:
- forming a pad oxide layer on a top surface of said top layer of semiconductor material;
- forming an SRAM region photoresist pattern on an existing top surface of said integrated circuit, said SRAM region photoresist pattern exposing said top layer of semiconductor material in said SRAM region;
- removing said pad oxide in said SRAM region by an oxide RIE process; and
- removing said top layer of semiconductor material in said SRAM region by a silicon RIE process.

\* \* \* \* \*